(12) United States Patent
Bar-Lev et al.

(10) Patent No.: US 9,385,712 B1
(45) Date of Patent: Jul. 5, 2016

(54) IMPEDANCE AND DUTY CYCLE CALIBRATION IN A DRIVER CIRCUIT AND A RECEIVER CIRCUIT

(71) Applicant: Marvell Israel (M.I.S.L) Ltd., Yokneam (IL)

(72) Inventors: Eldad Bar-Lev, Kiryat Tivon (IL); Ofer Benjamin, Haifa (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 0 days.

(21) Appl. No.: 14/809,877

(22) Filed: Jul. 27, 2015

Related U.S. Application Data

(63) Continuation of application No. 13/735,722, filed on Jan. 7, 2013, now Pat. No. 9,094,000.

(60) Provisional application No. 61/586,072, filed on Jan. 12, 2012.

(51) Int. Cl.
*H03K 19/00* (2006.01)
*H03K 19/0175* (2006.01)
*H04L 25/02* (2006.01)

(52) U.S. Cl.
CPC .......... *H03K 19/0005* (2013.01); *H04L 25/028* (2013.01); *H04L 25/0278* (2013.01)

(58) Field of Classification Search
CPC .................. H03K 19/0005; H03K 19/017545; H01L 25/0278; H01L 25/028
USPC .......................................................... 326/30
See application file for complete search history.

(56) References Cited

U.S. PATENT DOCUMENTS

| | | | |
|---|---|---|---|
| 6,949,949 B2 | 9/2005 | Lundberg | |
| 6,963,218 B1 | 11/2005 | Alexander et al. | |
| 7,598,762 B2 | 10/2009 | Byun et al. | |
| 8,570,063 B2 | 10/2013 | Grunzke | |
| 8,692,574 B2 | 4/2014 | Oh | |
| 2005/0104619 A1 | 5/2005 | Best et al. | |
| 2007/0013411 A1 | 1/2007 | Asaduzzaman et al. | |
| 2011/0049335 A1* | 3/2011 | Higgins | G02F 1/0516 250/214 C |
| 2012/0113733 A1 | 5/2012 | Kim et al. | |

* cited by examiner

*Primary Examiner* — Dylan White

(57) ABSTRACT

Some of the embodiments of the present disclosure provide a method including: communicating, by a first pin of an integrated circuit, with a device over a communication link, wherein the first pin is associated with a first impedance; selecting a plurality of impedance values for the first impedance; for ones of the plurality of impedance values, (i) transmitting a corresponding digital signal from the first pin over the communication link and (ii) generating a corresponding signal eye opening for the corresponding digital signal, such that a plurality of signal eye openings corresponding to a plurality of digitals signals for the corresponding plurality of impedance values are generated; comparing the plurality of signal eye openings; selecting a first impedance value of the plurality of impedance values; and transmitting signals over the communication link, with the first impedance being tuned to the first impedance value.

20 Claims, 6 Drawing Sheets

IMPEDANCE AND DUTY CYCLE CALIBRATION IN A DRIVER CIRCUIT AND A RECEIVER CIRCUIT

CROSS REFERENCE TO RELATED APPLICATIONS

The present application is a continuation of and claims priority to U.S. patent application Ser. No. 13/735,722, filed Jan. 7, 2013, now U.S. Pat. No. 9,094,000, issued Jul. 28, 2015, which claims priority to U.S. Provisional Patent Application No. 61/586,072, filed Jan. 12, 2012, which are incorporated herein by reference in their entirety.

TECHNICAL FIELD

Embodiments of the present disclosure relate to a driver circuit and a receiver circuit, and more specifically, to impedance and duty cycle calibration in a driver circuit and/or a receiver circuit.

BACKGROUND

The background description provided herein is for the purpose of generally presenting the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

In a computing system, a driver typically drives a signal to a receiver over a transmission bus. In practice, the respective impedances of the driver, the transmission bus and the receiver typically do not match (e.g., due to process/manufacturing variations, temperature variations, etc.). Furthermore, the impedance of the driver, the transmission bus and/or the receiver may change based on whether a "0" or a "1" is being transmitted. When impedances along a transmission bus are mismatched, reflections that cause jitter in the transmitted signal may result.

SUMMARY

In various embodiments, the present disclosure provides an integrated circuit communicating with a device over a multi-pin parallel bus, the integrated circuit comprising: at least a first pin and a second pin to communicate with the device over the multi-pin parallel bus; and an impedance tuning module disposed in the integrated circuit and configured to tune an impedance value of a first impedance associated the first pin separately from tuning an impedance value of a second impedance associated with the second pin.

In an embodiment, there is also provided a method comprising communicating, by at least a first pin and a second pin of an integrated circuit, with a device over a multi-pin parallel bus; tuning an impedance value of a first impedance associated the first pin of the integrated circuit; and independent of tuning the impedance value of the first impedance associated the first pin of the integrated circuit, tuning an impedance value of a second impedance associated the second pin of the integrated circuit.

BRIEF DESCRIPTION OF THE DRAWINGS

In the following detailed description, reference is made to the accompanying drawings which form a part hereof wherein like numerals designate like parts throughout, and in which is shown by way of embodiments that illustrate principles of the present disclosure. It is noted that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

DETAILED DESCRIPTION

Figure 1:
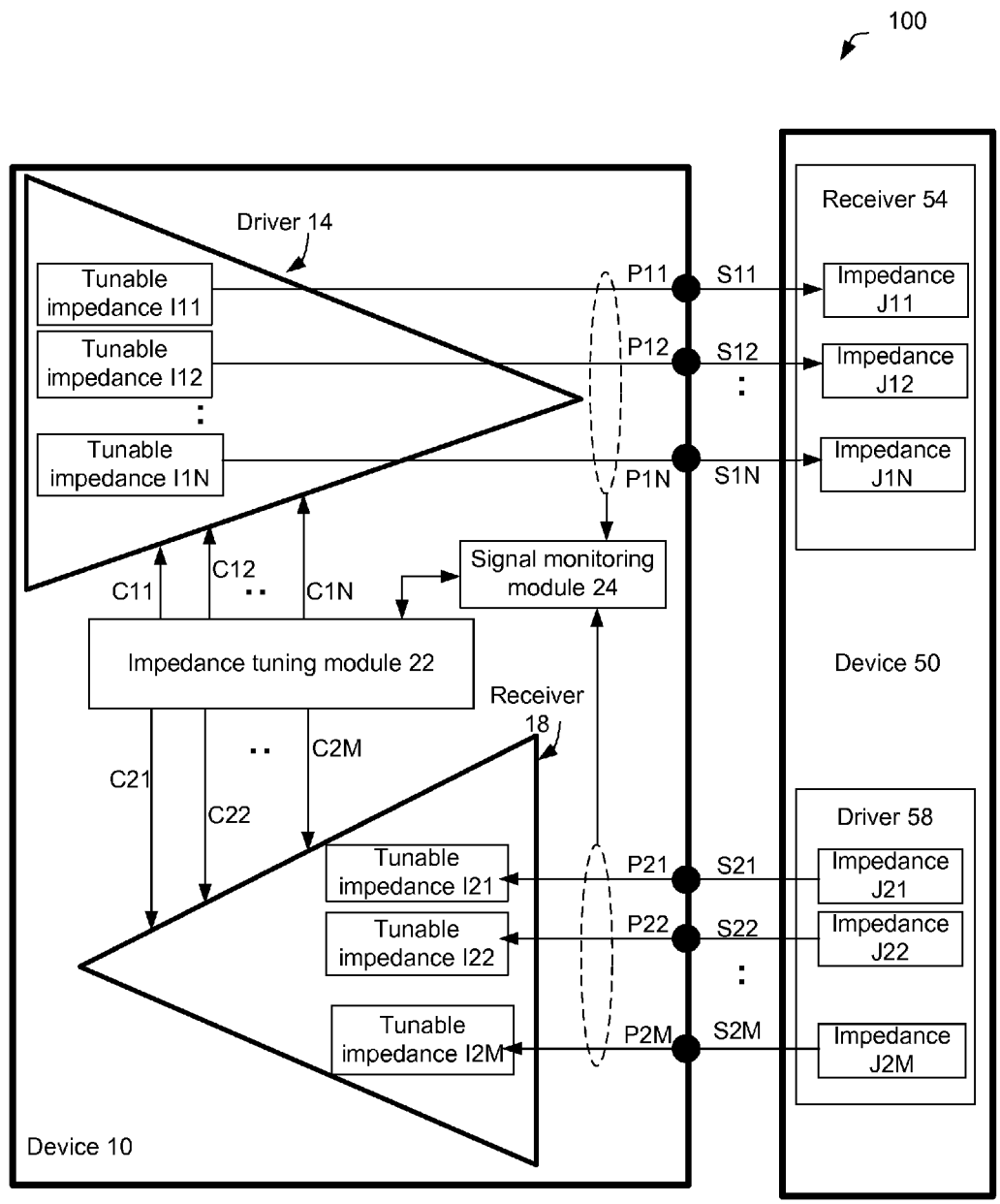
FIG. 1 schematically illustrates a computing system comprising a device communicatively coupled with another device.

FIG. 1 schematically illustrates a computing system 100 (henceforth referred to as "system 100") comprising a device 10 communicatively coupled with another device 50. The device 10 comprises a driver 14 coupled to a receiver 54 of the device 50. The driver 14 drives or transmits a multi-bit signal over a plurality of signal lines to the receiver 54. For example, the driver 14 is coupled to a plurality of signal lines S11, S12, . . . , S1N, respectively through a plurality of input/output pins (henceforth referred to as "pins") P11, P12, . . . , P1N of the device 10, where N is an appropriate integer. Each of the plurality of signal lines S11, S12, . . . , S1N is terminated respectively using impedances J11, J12, . . . , J1N in the receiver 54. Additionally, each of the plurality of signal lines S11, S12, . . . , S1N is respectively coupled to tunable impedances circuits (also referred to henceforth as "impedances" and/or "tunable impedances") I11, I12, . . . , I1N of the driver 14. In an embodiment, the signal lines S11, S12, . . . , S1N form a parallel bus between the driver 14 of the device 10 and the device 50. In an embodiment, the device 10 comprises an impedance tuning module 22, which outputs control signals C11, C12, . . . , C1N configured to tune impedance values of the impedances I11, I12, . . . , I1N, respectively.

In an embodiment, the device 10 also comprises a receiver 18 coupled to a driver 58 of the device 50. The driver 58 drives or transmits a multi-bit signal over a plurality of signal lines to the receiver 18. For example, the driver 58 is coupled to a plurality of signal lines S21, S22, . . . , S2M, which are coupled to the receiver 18 respectively through a plurality of pins P21, P22, . . . , P2M of the device 10, where M is an appropriate integer. In an embodiment, each of the plurality of signal lines S21, S22, . . . , S2M is terminated respectively using tunable impedances I21, I22, . . . , I2M in the receiver 18. Additionally, each of the plurality of signal lines S21, S22, . . . , S2M is respectively coupled to impedances J21, J22, . . . , J2M of the driver 58. In an embodiment, the signal lines S21, S22, . . . , S2M form a parallel bus between the driver 58 of the device 50 and the receiver 18 of the device 10. In an embodiment, the impedance tuning module 22 outputs control signals C21, C22, . . . , C2M configured to tune impedance values of the tunable impedances I21, I22, . . . , I2M, respectively.

In an embodiment, the device 10 also comprises a signal monitoring module 24 configured to monitor signals transmitted over the signal lines S11, . . . , S1N, S21, . . . , S2M (such monitoring is illustrated using two doted elliptical shapes in FIG. 1). For example, based on monitoring a signal line, the signal monitoring module 24 is configured to generate a data window or a signal eye opening of the signal transmitted in that signal line (e.g., which aids in tuning the tunable impedance associated with that signal line, as will be discussed in more detail herein later). Although FIG. 1 illustrates the signal monitoring module 24 monitoring each of the signal lines S11, . . . , S1N, S21, . . . , S2M, in an embodiment, the signal monitoring module 24 monitors only a subset of the signal lines S11, . . . , S1N, S21, . . . , S2M, as will be discussed in detail herein later. The signal monitoring module 24 is coupled to the impedance tuning module 22, and is configured to transmit to the impedance tuning module 22 information based on monitoring the signal lines.

In an embodiment, the impedance tuning module 22 tunes each of the impedances I11, I12, . . . , I1N, I21, I22, . . . , I2M, independent of each other. For example, the impedance tuning module 22 tunes the impedance I11 based on the impedances of the signal line S11 and impedance J11; the impedance tuning module 22 tunes the impedance I12 based on the impedances of the signal line S12 and impedance J12, and so on, e.g., such that the tuning of the impedance I11 is independent of tuning of the impedance I12. Such independent tuning of the impedances in the driver 14, for example, ensures proper impedance matching of an impedance in the driver 14 with the impedance of the corresponding signal line and the corresponding impedance in the receiver 54. Similarly, such independent tuning of the impedances in the receiver 18 ensures proper impedance matching of an impedance in the receiver 18 with the impedance of the corresponding signal line and the corresponding impedance in the driver 58. In an embodiment, the tuning of, for example, the impedance I11 is based at least in part on selecting various impedance values for the impedance I11, monitoring (e.g., by the signal monitoring module 24) a resultant signal eye opening of the signal transmitted over the signal line S11 for each of the various impedance values, and selecting one of the various impedance values for the impedance I11 by the impedance tuning module 22 based on the monitored signal eye openings, as will be discussed in more detail herein later.

The devices 10 and 50 can be any appropriate devices of a computing system. As an example, the device 10 may be an integrated circuit, a memory controller, a system on a chip (SoC), a processor, a Serializer/Deserializer (SerDes), and/or the like. As an example, the device 50 may be a memory module, a SerDes, any appropriate device that can be coupled to the device 10, and/or the like.

Figure 2:
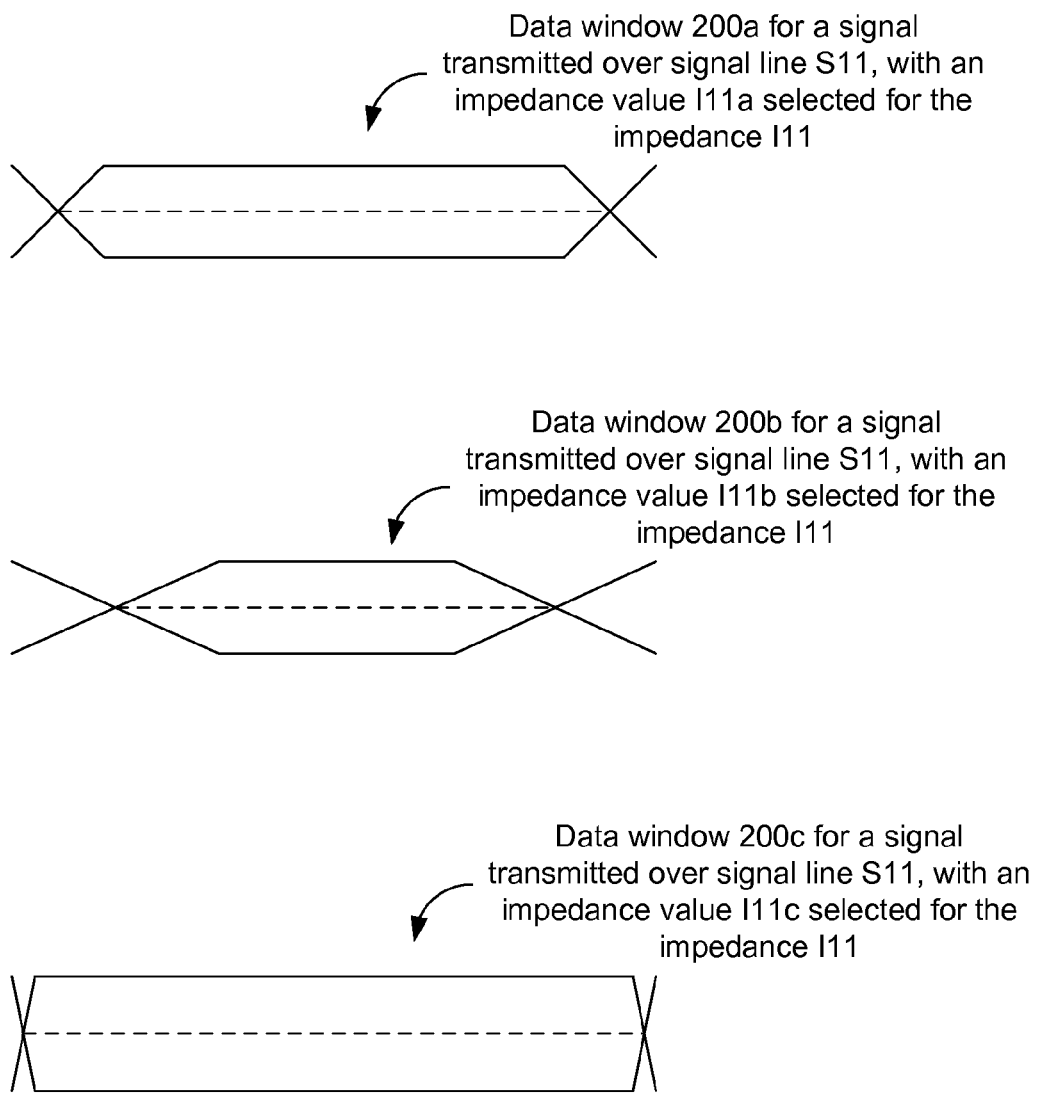
FIG. 2 illustrates signal eye openings for a signal transmitted over a signal line, with various impedance values selected for an impedance associated with the signal line.

FIG. 2 illustrates signal eye opening for a signal transmitted over the signal line S11, with various impedance values selected for the impedance I11. For example, the impedance tuning module 22 selects an impedance value of I11a for the impedance I11. With the impedance value I11a selected for the impedance I11, the driver 14 transmits a signal to the receiver 54 via the pin P11 and the signal line S11. In an example and as illustrated in FIG. 1, the signal transmitted over the signal line S11 is a single ended signal. In another example, the signal transmitted over the signal line S11 is a differential single (although the other signal line of the differential signal is not illustrated in FIG. 1). The signal monitoring module 24A monitors the signal transmitted over the signal line S11 and generates a corresponding signal eye opening 200a, as illustrated in FIG. 2. The signal eye opening 200a is, for example, a data window or an eye diagram of the signal transmitted over the signal line S11, while the impedance value I11a is selected for the impedance I11. In an embodiment, the impedance tuning module 22 further selects impedance values of I11b and I11c for the impedance I11. With each of the impedance values I11b and I11c selected for the impedance I11, the driver 14 transmits signal to the receiver 54 via the pin P11 and the signal line S11, and the signal monitoring module 24A generates corresponding signal eye openings 200b and 200c, as illustrated in FIG. 2.

Although FIG. 2 illustrates three signal eye openings corresponding to the three impedance values selected for the impedance I11, a different number (e.g., two, four, five, or more) of signal eye openings can be generated (e.g., by the signal monitoring module 24A) corresponding to the different number of impedance values selected (e.g., by the impedance tuning module 22) for the impedance I11.

In an embodiment, a slope of the edges of the signal eye openings of FIG. 2 is based on the corresponding impedance value selected for the impedance I11. The slopes of the edges of the various signal eye openings illustrated in FIG. 2 are different. For example, the slope of the edges of the signal eye opening 200c (e.g., which is a result of selecting the impedance value I11c for the impedance I11) is the highest, while the slope of the edges of the signal eye opening 200b (e.g., which is a result of selecting the impedance value I11b for the impedance I11) is the lowest. A window opening of a signal eye opening (illustrated using dotted lines in FIG. 2) varies based on the slope of the edges of the corresponding signal eye opening, as illustrated in FIG. 1. Thus, an opening of a signal eye opening also varies based on the corresponding selected impedance value of the impedance I11.

In the example of FIG. 2, each of the signal eye openings has different window openings. For example, the signal eye opening 200c has the largest window opening and the signal eye opening 200c has the smallest window opening. Having a large window opening is useful, for example, especially while transmitting high speed signals (e.g., as such a large window opening provides sufficient time to detect at the receiver whether a "1" or a "0" has been transmitted).

In an embodiment, based on generating the signal eye openings 200a, . . . , 200c, the impedance tuning module 22 selects one of the signal eye openings 200a, . . . , 200c. For example, for the signal transmitted over the signal line S11, the impedance tuning module 22 selects a signal eye opening that maximizes a window opening of the signal eye opening. Accordingly, in the example of FIG. 2, for the signal transmitted over the signal line S11, the impedance tuning module 22 selects the signal eye opening 200c from the signal eye openings 200a, . . . , 200c, and tunes the impedance I11 to the impedance value I11c for the regular operation of the system 10. Such a selection, for example, results in a relatively large window opening of the selected signal eye opening, and is useful, for example, especially while transmitting high speed signals (e.g., as such a large window opening provides sufficient time to detect at the receiver whether a "1" or a "0" has been transmitted).

Although FIG. 2 illustrates generating signal eye openings associated with the impedance I11 only, in an embodiment, the impedance tuning module 22 and the signal monitoring module 24 generates signal eye openings for ones of the impedances I12, I13, . . . , I1N, I21, . . . , I2M in a similar manner. Based on these signal eye openings, the impedance tuning module 22 selects appropriate values for these impedances, e.g., similar to the manner as discussed with respect to the impedance I11.

Figure 3:
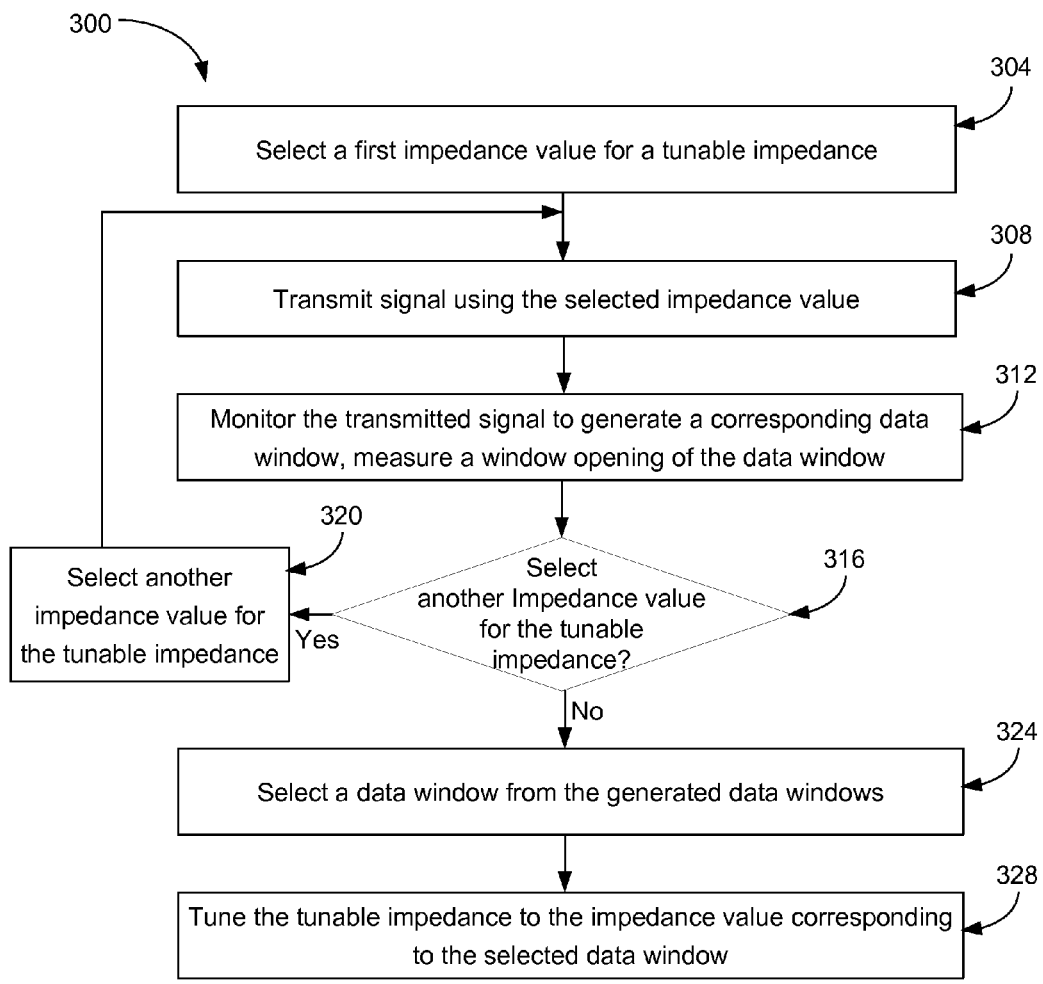
FIG. 3 illustrates an example method for tuning a tunable impedance.

FIG. 3 illustrates an example method 300 for tuning a tunable impedance of the system 100 of FIG. 1. The method 300 can be used to tune any of the tunable impedances I11, I21, ..., I1N, I21, I22, ..., I2M of FIG. 1; however, merely as an example, the method 300 has been discussed with respect to tuning the impedance I11 of FIG. 1.

Referring to FIGS. 1-3, at 304, the impedance tuning module 22 selects a first impedance value for a tunable impedance (e.g., the impedance I11) of the device 10. For example, the impedance tuning module 22 selects a first impedance value I11a (e.g., as illustrated in FIG. 2) for the impedance I11. At 308, the driver 14 transmits a signal (e.g., via the pin P11 and the signal line S11) using the selected impedance value of I11a. At 312, the signal monitoring module 24 monitors the transmitted signal to generate a corresponding signal eye opening (e.g., the signal eye opening 200a of FIG. 2), and measures a window opening (e.g., as illustrated using dotted line in FIG. 2) for the generated signal eye opening.

At 316, the impedance tuning module 22 determines if another impedance value is to be selected for the tunable impedance I11. In an example, the impedance tuning module 22 may select at least a predetermined threshold number of impedance values for the tunable impedance I11 during the method 300. In another example, the impedance tuning module 22 continues selecting additional impedance values for the impedance I11, until a satisfactory signal eye opening (e.g., having a satisfactory window opening width) is generated at 312. In yet another example, any other appropriate criterion is used for the determination at 316.

If "Yes" at 316 (i.e., if another impedance value is to be selected for the tunable impedance I11), then the impedance tuning module 22 selects another impedance value (e.g., the impedance value I11b, as discussed with respect to FIG. 2) for the tunable impedance I11 at 320, and the method 300 loops back to 308.

If "No" at 316 (i.e., if another impedance value is not to be selected for the tunable impedance I11), then at 324, the impedance tuning module 22 selects a signal eye opening from the signal eye openings generated at 312. In an example, signal eye openings 200a, 200b and 200c are generated at various iterations of 312, and at 324, one of the signal eye openings 200a, 200b and 200c is selected. Selection of the signal eye opening at 324 can be based on one or more appropriate selection criteria. For example, for a high speed system (e.g., where signals are transmitted at a high frequency between the devices 10 and 50), a signal eye opening with a relatively large window opening is selected. For example, the signal eye opening 200c (e.g., which has the largest window opening of the signal eye openings 200a, 200b and 200c) is selected.

At 328, the impedance tuning module 22 tunes the tunable impedance I11 to the impedance value corresponding to the selected signal eye opening. For example, if the signal eye opening 200c is selected, the impedance tuning module 22 tunes the tunable impedance I11 to the impedance value I11c.

The method 300 performs a one dimensional search across possible impedance values, to select an optimal or near optimal impedance value for the impedance I11. The method 300 may be performed during an initialization phase of the device 10 (e.g., when the device 10 is powered on, used for the first time with the device 50, etc.), while tuning the impedance I11, and/or at a periodic interval.

In FIGS. 2 and 3, a signal eye opening from a plurality of signal eye openings (e.g., signal eye openings 200a, 200b and 200c) is selected based on maximizing a window opening of the selected signal eye opening. Having a large signal eye opening is useful in high speed signal transmission, as such a large signal eye opening maximizes a time window in which a value of the signal (i.e., whether the signal has a value of "1" or "0") is to be detected. However, any other criterion may also be used to select the signal eye opening. For example, in low speed signal transmission applications, in order to decrease a power required for signal transmission, a signal eye opening can be selected that provides a satisfactory window opening and yet saves power. For example, a relatively small window opening of a signal eye opening reduces power consumption (and also reduces generation of thermal power), while a relatively large window opening of a signal eye opening improves signal detection. An optimization of the signal eye opening can be performed, e.g., by selecting an appropriate signal eye opening, which optimizes (or nearly optimizes) on both power consumption and signal detection.

As an example, referring to FIG. 2, for a low speed and low power application, it is determined that the window openings of each of the signal eye openings 200a and 200c are satisfactory for signal detection (e.g., determine that the window openings of each of the signal eye openings 200a and 200c are at least as large as a threshold window opening needed for satisfactory signal detection). However, it may be determined that the impedance value I11a results in relatively less power consumption (and accordingly, less thermal power generation) for signal transmission over the signal line S11, compared to that with the impedance value I11c. Accordingly, in such a scenario, the signal eye opening 200a is selected at 324 of method 300, and the impedance I11 is tuned to the impedance value of I11a at 328 of the method 300.

In an embodiment, one or more impedances of the driver 14 and/or the receiver 18 are resistive in nature (e.g., comprising one or more resistors). Accordingly, selecting an impedance value for an impedance, as discussed with respect to FIGS. 2 and 3, comprises selecting a resistance value of one or more resistors of the impedance. In another embodiment, one or more impedances of the driver 14 and/or the receiver 18 are inductive and/or capacitive in nature (e.g., comprising one or more inductors and/or capacitors). Accordingly, selecting an impedance value for an impedance, as discussed with respect to FIGS. 2 and 3, comprises selecting an inductance and/or capacitance value for the impedance.

Figure 4:
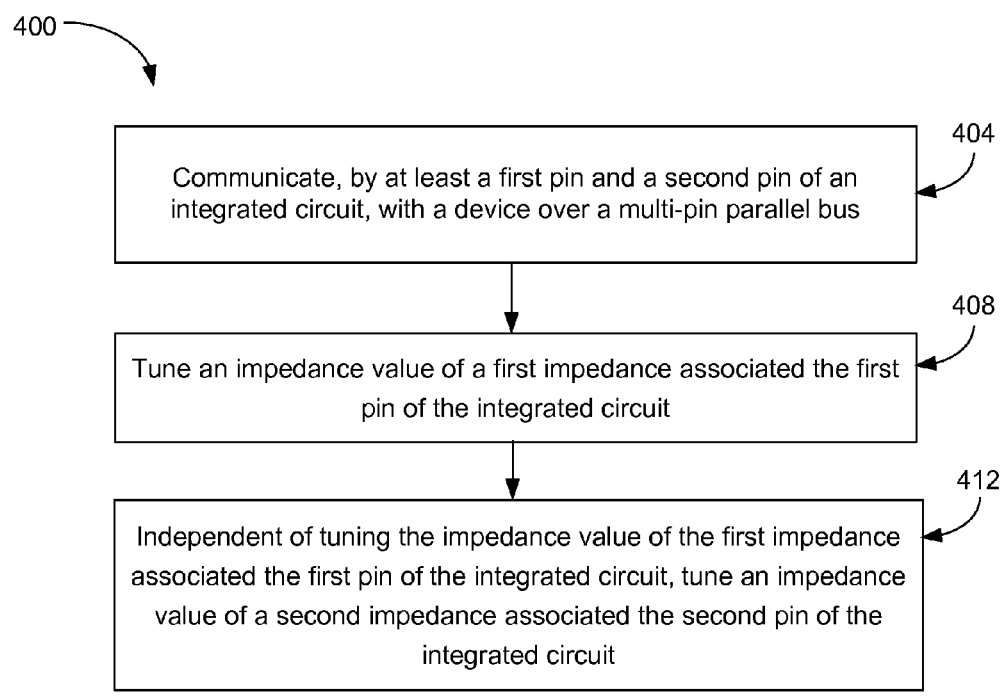
FIG. 4 illustrates an example method for tuning two tunable impedances.

FIG. 4 illustrates an example method 400 for tuning two tunable impedances of the system 10 of FIG. 1. At 404, at least a first pin (e.g., pin P11) and a second pin (e.g., pin P12) of an integrated circuit (e.g., the device 10) communicate with a device (e.g., device 50) over a multi-pin parallel bus (e.g., a parallel bus comprising two or more of the signal lines S11, S12, ..., S1N). At 408, an impedance value of a first impedance (e.g., impedance I11) associated the first pin of the integrated circuit is tuned (e.g., by the impedance tuning module 22 in accordance with, for example, the method 300). At 412, independent of tuning the impedance value of the first impedance associated the first pin of the integrated circuit, an impedance value of a second impedance (e.g., impedance I12) associated the second pin of the integrated circuit is tuned (e.g., by the impedance tuning module 22 in accordance with, for example, the method 300).

Independent tuning of the two impedances, as illustrated in FIG. 4, has several advantages. For example, the signal lines S11 and S12 may traverse different physical layers and different distances before reaching the receiver 54. For this reason and/or for other reasons (e.g., due to manufacturing/process variations), the signal lines S11 and S12 may have different impedance values. Similarly, the termination impedances J11 and J12 may also have different impedance values. Accordingly, an impedance value that is optimum (or near optimum) for the impedance I11 may not provide satisfactory result if selected for the impedance I12. Accordingly, independently tuning the impedances I11 and I12 ensures that each of these impedances are calibrated or tuned to provide optimum or near optimum result for the corresponding signals.

In an embodiment, the impedances I11, I12, . . . , I1N, I21, I22, . . . , I2M are grouped in various groups, and impedances of each group are tuned in a similar manner (whereas impedance of two different groups of impedances are tuned independent of each other). As an example, assume that the device 10 is an integrated circuit comprising a memory controller, and the device 50 is a memory device comprising a plurality of memory banks. Also assume that a first memory bank of the device 50 is physically located closer to the device 10, while a second memory bank of the device 50 is physically located at a large distance away from the device 10. Also assume that the impedances I11, I12 and I13 couple the driver 14 of the device 10 to the first memory bank, while the impedances I14, 115 and 116 couple the driver 14 of the device 10 to the second memory bank. Accordingly, the signal lines S11, S12, and S13 would be of substantially similar length (and, for example, traverse through similar layers of silicon), and accordingly, have substantially similar impedance value, in an embodiment. Similarly, the signal lines S14, S15, and S16 would be of substantially similar length (and, for example, traverse through similar layers of silicon), and accordingly, have substantially similar impedance value. However, as the first memory bank is located closer to the device 10 compared to the second memory bank, the length and the impedances of the signal lines S11, S12, and S13 may be different from those of the signal lines S14, S15, and S16. As the individual impedances of the driver 14 are tuned based on the impedance values of the corresponding signal lines and the corresponding impedance of the receiver 54, the impedances I11, I12 and I13 can be tuned in a similar manner. For example, the impedances I11, I12 and I13 are grouped in a first group. Also, instead of individually tuning each of the impedances I11, I12 and I13, any one impedance of the first group is tuned (e.g., in accordance with the methods 300 and/400), and the tuning result is applied to other impedances of the first group. Similarly, the impedances I14, 115 and 116 are grouped in a second group. Also, any one impedance of the second group is tuned (e.g., in accordance with the methods 300 and/400), and the tuning result is applied to other impedances of the second group.

Grouping the impedance of the driver 14 and/or the receiver 18 in groups, and tuning only a single impedance from each group, as discussed above, accelerates the tuning process of the impedances of the driver 14 and the receiver 18. During such group tuning of the impedances, the signal monitoring module 24 monitors signals for only one impedance per group (e.g., for which the tuning is performed). That is, in such a scenario, the signal monitoring module 24 need not monitor signals associated with each of the impedances of the driver 14 and the receiver 18.

Figure 5:
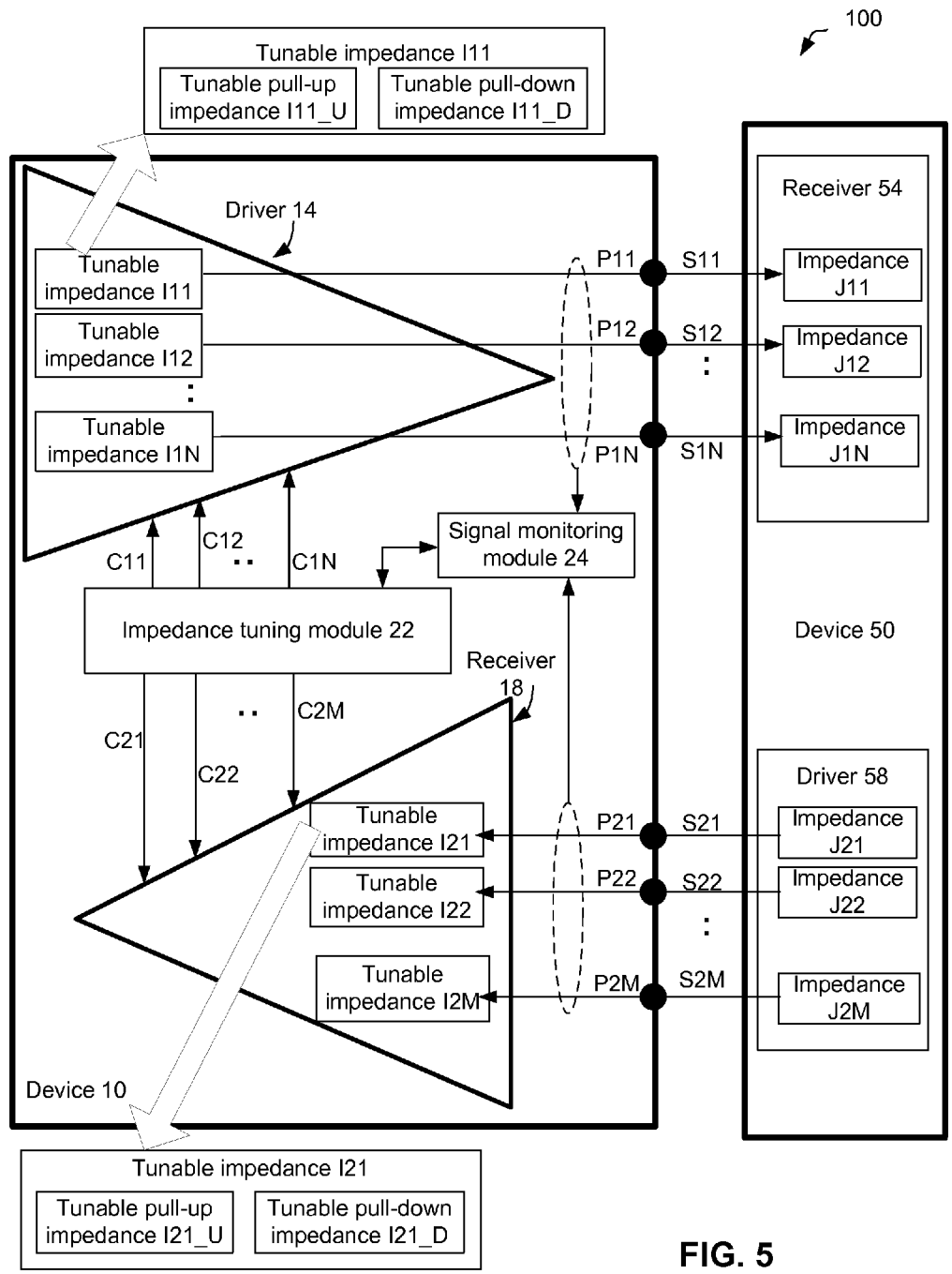
FIG. 5 schematically illustrates the computing system of FIG. 1, with two tunable impedances of the computing system illustrated in more detail.

FIG. 5 illustrates the system 100 of FIG. 1, with two of the tunable impedances illustrated in more detail. In the example of FIG. 5, the impedance I11 comprises a tunable pull-up impedance (henceforth also referred to as pull-up impedance) I11_U and a tunable pull-down impedance (henceforth also referred to as pull-down impedance) I11_D; and the impedance I21 comprises a pull-up impedance I21_U and a pull-down impedance I21_D. Although one or more (e.g., each) of the other impedances I12, . . . , I1N, I22, . . . , I2M also includes a corresponding pull-up and a corresponding pull-down impedances, these are not illustrated in FIG. 5 for illustrative clarity.

In an embodiment, the pull-up impedance I11_U is used as the impedance I11 while transmitting 1s over the signal line S11, and the pull-down impedance I11_D is used as the impedance I11 while transmitting 0s over the signal line S11. That is, the pull-up impedance I11_U and the pull-down impedance I11_D are selectively switched and coupled to the pin P11, based on whether a 0 or a 1 is to be transmitted over signal line S11. In an embodiment, each of the pull-up impedance I11_U and the pull-down impedance I11_D are tuned separately and independently by the impedance tuning module 22.

Figure 6:
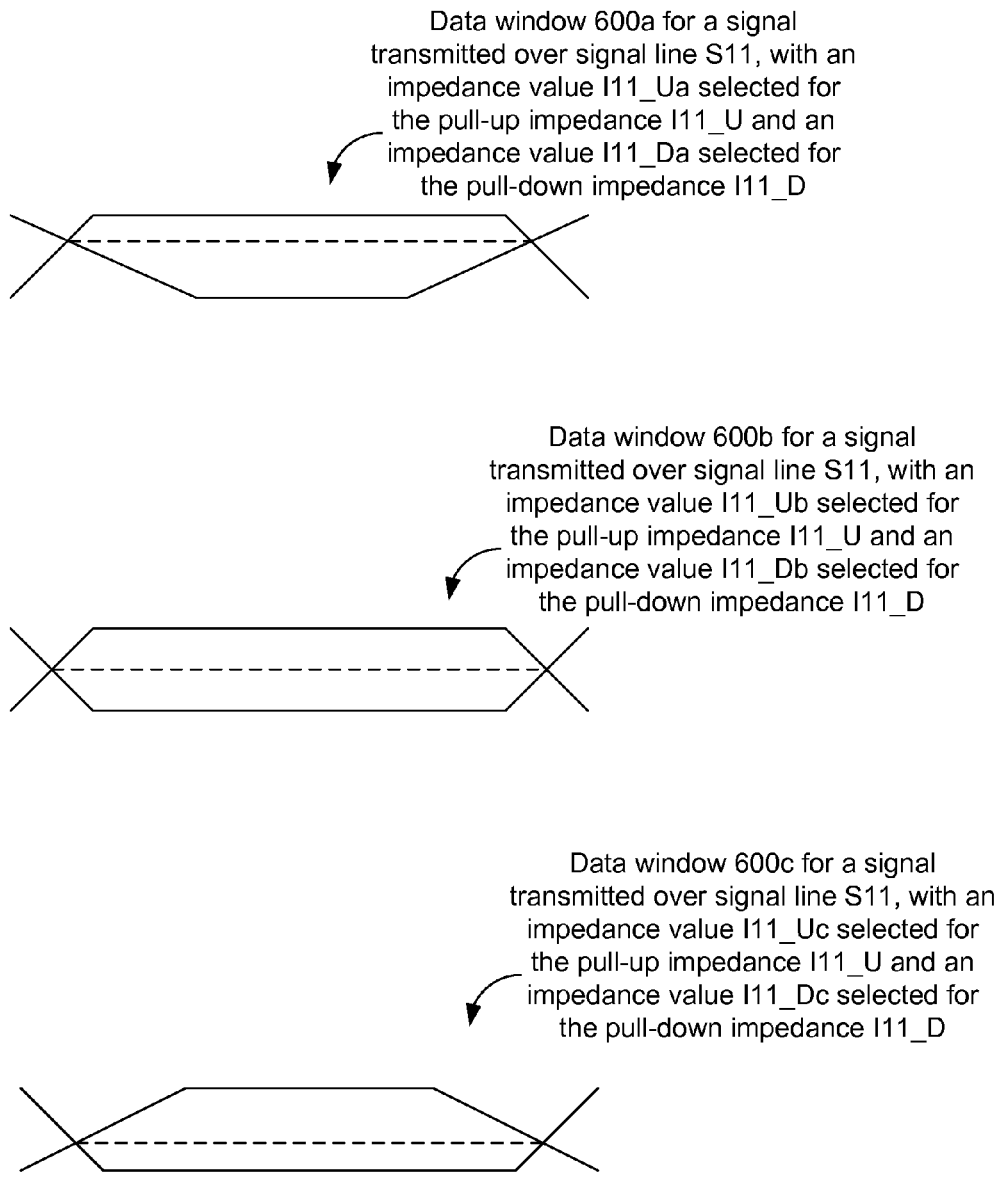
FIG. 6 illustrates signal eye openings for a signal transmitted over a signal line, with various impedance values selected for each of a pull-up impedance and a pull-down impedance.

FIG. 6 schematically illustrates signal eye openings for a signal transmitted over the signal line S11, with various impedance values selected for each of the pull-up impedance I11_U and the pull-down impedance I11_D of the impedance I11. For example, the impedance tuning module 22 selects an impedance value I11_Ua for the pull-up impedance I11_U and an impedance value I11_Da for the pull-down impedance I11_D, the driver 14 transmits 1s and 0s based on the selected impedances, and the signal monitoring module 24 generates a corresponding signal eye opening 600a, as illustrated in FIG. 6. Signal eye openings 600b and 600c are also generated similarly corresponding to impedance values I11_Ub and I11_Uc for the pull-up impedance I11_U, respectively, and impedance values I11_Db and I11_Dc for the pull-down impedance I11_D, respectively.

As illustrated in FIG. 6, the generated signal eye openings can be vertically asymmetrical or vertically symmetrical (or vertically substantially symmetrical). For example, the signal eye openings 600a and 600c are vertically asymmetrical, whereas the signal eye opening 600b is vertically substantially symmetrical.

Vertical symmetry of a signal eye opening of a signal is helpful in correct detection of the signal (e.g., to differentiate between a "0" and a "1" while detecting the signal at the receiver). For example, due to a vertical asymmetry in the signal eye opening, an ideal reference voltage to differentiate between a "0" and a "1" may be different from an actual reference voltage used to differentiate between a "0" and a "1," thereby increasing a probability of error in detecting the signal.

As previously discussed, a slope of an edge of a signal eye opening of FIG. 6 is based on, for example, the corresponding pull-up impedance I11_U and the pull-down impedance I11_D. Furthermore, for example, the termination impedance J11 may also have separate pull-up impedance and pull-down impedance (which may have different impedance values).

Additionally or alternatively, the signal line S11 may behave differently (e.g., have different impedance values) while transmitting a "0" and while transmitting a "1." Accordingly, some of the signal eye openings may have vertical asymmetry, based on the impedance values selected for the pull-up impedance I11_U and the pull-down impedance I11_D. The vertical asymmetry in the signal eye opening may be due to a difference in a rise time and a fall time at an edge of the signal eye opening, which are controlled by the pull-up impedance I11_U and the pull-down impedance I11_D. Thus, it is possible to control the symmetry of the signal eye opening by selectively tuning the pull-up impedance I11_U and the pull-down impedance I11_D.

For example, while selecting the impedance values of the impedance I11 at 320 of the method 300 of FIG. 3, the impedance tuning module 22 selects various values of the pull-up impedance I11_U and the pull-down impedance I11_D, and generates corresponding signal eye openings (e.g., some of which are illustrated in FIG. 6). At 324 of the method 300 of FIG. 3, for example, the impedance tuning module 22 selects a signal eye opening that has a relatively large window opening (e.g., compared to other signal eye openings) and that is vertically symmetrical (or nearly or substantially vertically symmetrical, e.g., compared to other signal eye openings). For example, if the signal eye openings 600a, 600b and 600c of FIG. 6 are generated during the method 300, the impedance tuning module 22 selects the signal eye opening 600b based on the signal eye opening 600b being vertically symmetrical (or nearly or substantially vertically symmetrical), e.g., compared to the signal eye openings 600a and 600c. In such a scenario, the pull-up impedance I11_U and the pull-down impedance I11_D are respectively tuned to the impedance values I11_Ub and I11_Db.

Thus, in FIG. 6, a two dimensional search across possible impedance values for each of the pull-up impedance I11_U and the pull-down impedance I11_D is performed, to select optimal or near optimal impedance values for the pull-up impedance I11_U and the pull-down impedance I11_D.

Similar to the tuning of the pull-up impedance I11_U and the pull-down impedance I11_D, the pull-up impedance and the pull-down impedance of other impedances (e.g., I12, . . . , I1N, I21, . . . , I2M) are also tuned.

The description incorporates use of the phrases "in an embodiment," or "in various embodiments," which may each refer to one or more of the same or different embodiments. Furthermore, the terms "comprising," "including," "having," and the like, as used with respect to embodiments of the present disclosure, are synonymous.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Although specific embodiments have been illustrated and described herein, it is noted that a wide variety of alternate and/or equivalent implementations may be substituted for the specific embodiment shown and described without departing from the scope of the present disclosure. The present disclosure covers all methods, apparatus, and articles of manufacture fairly falling within the scope of the appended claims either literally or under the doctrine of equivalents. This application is intended to cover any adaptations or variations of the embodiment disclosed herein. Therefore, it is manifested and intended that the present disclosure be limited only by the claims and the equivalents thereof.

What is claimed is:

1. A method for tuning an impedance included in an integrated circuit, the method comprising:
communicating, by at least a first pin of the integrated circuit, with a device over a communication link, wherein the first pin of the integrated circuit is associated with a first impedance;
selecting, by an impedance tuning module, a plurality of impedance values for the first impedance;
for ones of the plurality of impedance values being selected for the first impedance, (i) transmitting, by the integrated circuit, a corresponding digital signal from the first pin over the communication link and (ii) generating, by a signal monitoring module, a corresponding signal eye opening for the corresponding digital signal, such that a plurality of signal eye openings corresponding to a plurality of digitals signals for the corresponding plurality of impedance values are generated;
comparing, by the impedance tuning module, the plurality of signal eye openings;
based on comparing the plurality of signal eye openings, selecting, by the impedance tuning module, a first impedance value of the plurality of impedance values for the first impedance;
tuning the first impedance to substantially the first impedance value; and
transmitting, by the integrated circuit, signals over the communication link, with the first impedance being substantially tuned to the first impedance value, such that the transmitted signals have substantially a first signal eye opening.

2. The method of claim 1, wherein the plurality of signal eye openings comprises at least (i) the first signal eye opening that is generated while the first impedance value of the of the plurality of impedance values is selected and (ii) a second signal eye opening that is generated while a second impedance value of the of the plurality of impedance values is selected, wherein (i) the first signal eye opening has a first window opening and (ii) the second signal eye opening has a second window opening, and wherein comparing the plurality of signal eye openings comprises:
comparing, by the impedance tuning module, a dimension of the first window opening with a dimension of the second window opening.

3. The method of claim 2, wherein selecting the first impedance value for the first impedance comprises:
determining that the first window opening of the first signal eye opening is larger than the second window opening of the second signal eye opening; and
in response to determining that the first window opening is larger than the second window opening, selecting the first impedance value for the first impedance.

4. The method of claim 2, wherein selecting the first impedance value for the first impedance comprises:
determining that each of (i) the first window opening of the first signal eye opening and (ii) the second window opening of the second signal eye opening is at least as large as a threshold window opening;
determining that a first power required to operate the integrated circuit with the first impedance value selected for the first impedance is lower than a second power required to operate the integrated circuit with the second impedance value selected for the first impedance; and
in response to determining that the first power is lower than the second power, selecting the first impedance value for the first impedance.

5. The method of claim 4, wherein selecting the first impedance value for the first impedance further comprises:
in response to determining that the first power is lower than the second power, selecting the first impedance value for the first impedance, irrespective of a relative length of the first window opening and the second window opening.

6. The method of claim 1, wherein selecting the first impedance value for the first impedance comprises:
selecting the first impedance value of the plurality of impedance values so as to generate a maximally open first signal eye opening of the signals transmitted from the first pin over the communication link.

7. The method of claim 1, wherein selecting the first impedance value for the first impedance comprises:
   selecting the first impedance value of the plurality of impedance values such that a first signal eye opening of the signals transmitted from the first pin over the communication link is substantially vertically symmetric.

8. The method of claim 1, wherein generating the corresponding signal eye opening for the corresponding digital signal comprises:
   with the first impedance value of the plurality of impedance values being selected for the first impedance, transmitting a corresponding first digital signal from the first pin over the communication link; and
   generating a first signal eye opening, while the first impedance value of the plurality of impedance values is selected for the first impedance, such that the first signal eye opening represents a data window or an eye diagram of the first digital signal.

9. The method of claim 1, wherein the integrated circuit comprises a second pin that is associated with a second impedance, and wherein the method further comprises:
   selecting a second impedance value for the second impedance; and
   transmitting, by at least the second pin of the integrated circuit, signals over the communication link, with the second impedance value being selected for the second impedance.

10. The method of claim 9, wherein selecting the second impedance value for the second impedance comprises:
    independent of selecting the first impedance value for the first impedance, selecting the second impedance value for the second impedance.

11. An integrated circuit configured to communicate with a device over a communication link, the integrated circuit comprising:
    a first pin configured to communicate with the device over the communication link, wherein the device is external to the integrated circuit; and
    an impedance tuning module disposed in the integrated circuit and configured to:
       select a plurality of impedance values for the first impedance,
       for ones of the plurality of impedance values being selected for the first impedance, (i) transmit a corresponding digital signal from the first pin over the communication link and (ii) generate a corresponding signal eye opening for the corresponding digital signal, such that a plurality of signal eye openings corresponding to a plurality of digitals signals for the corresponding plurality of impedance values are generated,
       compare the plurality of signal eye openings, and
       based on comparing the plurality of signal eye openings, select a first impedance value of the plurality of impedance values for the first impedance, the integrated circuit transmitting signals over the communication link via the first pin, with the first impedance value being selected for the first impedance.

12. The integrated circuit of claim 11, wherein the plurality of signal eye openings comprises at least (i) a first signal eye opening that is generated while the first impedance value of the of the plurality of impedance values is selected and (ii) a second signal eye opening that is generated while a second impedance value of the of the plurality of impedance values is selected, wherein (i) the first signal eye opening has a first window opening and (ii) the second signal eye opening has a second window opening, and wherein the impedance tuning module comprises:
    circuitry to compare plurality of signal eye openings by comparing a dimension of the first window opening with a dimension of the second window opening.

13. The integrated circuit of claim 12, wherein the circuitry is configured to select the first impedance value for the first impedance by:
    determining that the first window opening of the first signal eye opening is larger than the second window opening of the second signal eye opening; and
    in response to determining that the first window opening is larger than the second window opening, selecting the first impedance value for the first impedance.

14. The integrated circuit of claim 12, wherein the circuitry is configured to select the first impedance value for the first impedance by:
    determining that each of (i) the first window opening of the first signal eye opening and (ii) the second window opening of the second signal eye opening is at least as large as a threshold window opening;
    determining that a first power required to operate the integrated circuit with the first impedance value selected for the first impedance is lower than a second power required to operate the integrated circuit with the second impedance value selected for the first impedance; and
    in response to determining that the first power is lower than the second power, selecting the first impedance value for the first impedance.

15. The integrated circuit of claim 14, wherein the impedance tuning module is further configured to select the first impedance value for the first impedance by:
    in response to determining that the first power is lower than the second power, selecting the first impedance value for the first impedance, irrespective of a relative length of the first window opening and the second window opening.

16. The integrated circuit of claim 11, wherein the impedance tuning module is configured to select the first impedance value for the first impedance by:
    selecting the first impedance value of the plurality of impedance values so as to generate a maximally open first signal eye opening of the signals transmitted from the first pin over the communication link.

17. The integrated circuit of claim 11, wherein the impedance tuning module is configured to select the first impedance value for the first impedance by:
    selecting the first impedance value of the plurality of impedance values such that a first signal eye opening of the signals transmitted from the first pin over the communication link is substantially vertically symmetric.

18. The integrated circuit of claim 11, wherein the impedance tuning module comprises:
    circuitry to generate the corresponding signal eye opening for the corresponding digital signal by, (i) with the first impedance value of the plurality of impedance values being selected for the first impedance, transmitting a corresponding first digital signal from the first pin over the communication link, and (ii) generating a first signal eye opening, while the first impedance value of the plurality of impedance values is selected for the first impedance, such that the first signal eye opening represents a data window or an eye diagram of the first digital signal.

19. The integrated circuit of claim 11, wherein the integrated circuit comprises a second pin that is associated with a second impedance, and wherein the impedance tuning module is further configured to:
   select a second impedance value for the second impedance, wherein the integrated circuit is configured to transmit signals over the communication link via the second pin, with the second impedance value being selected for the second impedance.

20. The integrated circuit of claim 19, wherein the impedance tuning module is configured to select the second impedance value for the second impedance, independent of selecting the first impedance value for the first impedance.

\* \* \* \* \*